United States Patent
Okuda et al.

(10) Patent No.: US 8,778,570 B2
(45) Date of Patent: Jul. 15, 2014

(54) PHOTOMASK AND METHOD FOR MANUFACTURING THE SAME

(75) Inventors: Kentaro Okuda, Kanagawa-ken (JP); Yosuke Okamoto, Mie-ken (JP); Takaki Hashimoto, Kanagawa-ken (JP); Hidenori Sato, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/409,638

(22) Filed: Mar. 1, 2012

(65) Prior Publication Data

US 2012/0225374 A1 Sep. 6, 2012

(30) Foreign Application Priority Data

Mar. 2, 2011 (JP) ................. 2011-045150

(51) Int. Cl.
*G03F 1/42* (2012.01)
*G03F 1/44* (2012.01)

(52) U.S. Cl.
USPC ............................................................ 430/5

(58) Field of Classification Search
CPC .............................................. G03F 1/42
USPC ............................................................ 430/5
See application file for complete search history.

(56) References Cited

U.S. PATENT DOCUMENTS

| 2002/0058188 A1* | 5/2002 | Iwasaki et al. ................. 430/5 |
| 2003/0082463 A1* | 5/2003 | Laidig et al. ................... 430/5 |
| 2009/0075178 A1* | 3/2009 | Jahnke et al. .................. 430/5 |

FOREIGN PATENT DOCUMENTS

| CN | 101833236 A | 9/2010 |
| JP | 5-142745 | 6/1993 |
| JP | 6-124868 A | 5/1994 |
| JP | 8-36255 A | 2/1996 |
| JP | 2001-201844 A | 7/2001 |
| JP | 2006-47564 | 2/2006 |
| JP | 2008-145918 | 6/2008 |
| JP | 2008-151821 A | 7/2008 |
| JP | 2009-231564 | 10/2009 |

OTHER PUBLICATIONS

Office Action issued Jan. 30, 2013 in Japanese Patent Application No. 2011-045150 (with English-language translation).
Office Action issued Jun. 25, 2013 in Korean Patent Application No. 10-2012-21914 (with English translation).
Combined Office Action and Search Report issued Nov. 1, 2013 in Chinese Patent Application No. 201210053889.0 (with English language translation).

* cited by examiner

*Primary Examiner* — Mark F Huff
*Assistant Examiner* — John S Ruggles
(74) *Attorney, Agent, or Firm* — Oblon, Spivak, McClelland, Maier & Neustadt, L.L.P.

(57) ABSTRACT

According to one embodiment, a photomask includes a substrate, a film portion, a pattern, and a plurality of detection marks. The film portion is provided on a surface of the substrate. The film portion has a light transmittance lower than light transmittance of the substrate. The pattern is provided in a surface of the film portion. The pattern is configured to be transferred to a transfer target. The plurality of detection marks is provided in the film portion, with intensity of light transmitted through the detection marks being suppressed so as to suppress transfer the detection marks to the transfer target.

11 Claims, 7 Drawing Sheets

PHOTOMASK AND METHOD FOR MANUFACTURING THE SAME

CROSS-REFERENCE TO RELATED APPLICATIONS

This application is based upon and claims the benefit of priority from the prior Japanese Patent Application No. 2011-045150, filed on Mar. 2, 2011; the entire contents of which are incorporated herein by reference.

FIELD

Embodiments described herein relate generally to a photomask and a method for manufacturing the same.

BACKGROUND

Recently, patterns formed in microstructures such as semiconductor devices have become increasingly finer. This requires very strict accuracy in the photomask used in the photolithography process for forming such fine patterns.

A technique has been proposed in this context. In this technique, a detection mark formed in the writing region of the photomask is transferred to the light exposure surface of the wafer. By detecting the transferred detection mask, the accuracy of the photomask itself and the accuracy of superposition are inspected.

However, because the detection mark is transferred to the light exposure surface of the wafer, the position for forming the detection mark is significantly restricted.

This results in poor inspection measurement accuracy and makes it difficult to manufacture a photomask with high accuracy.

BRIEF DESCRIPTION OF THE DRAWINGS

FIG. 1A is a schematic plan view of the photomask according to the first embodiment, FIG. 1B is a schematic enlarged view of the cross section taken in the direction of arrows A-A in FIG. 1A. FIG. 1C is a view taken in the direction of arrows B-B.

DETAILED DESCRIPTION

Figure 1A:
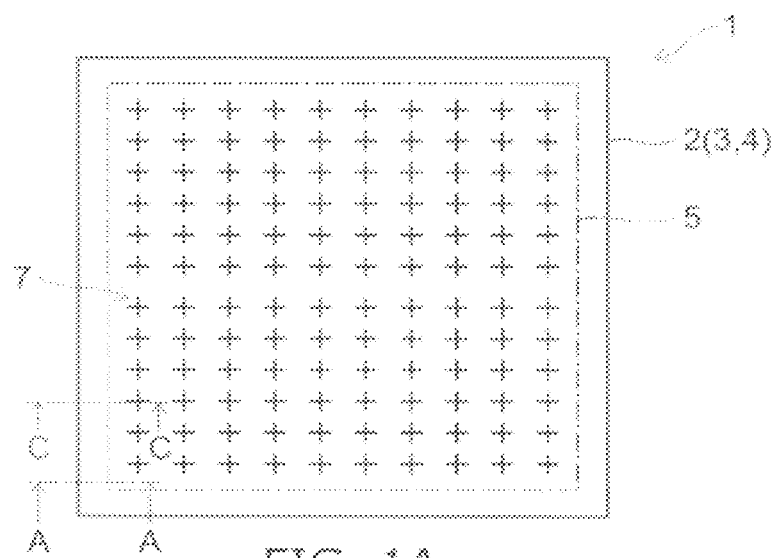
FIGS. 1A to 1C are schematic views for illustrating a photomask according to a first embodiment, specifically.

In general, according to one embodiment, a photomask includes a substrate, a film portion, a pattern, and a plurality of detection marks. The film portion is provided on a surface of the substrate. The film portion has a light transmittance lower than light transmittance of the substrate. The pattern is provided in a surface of the film portion. The pattern is configured to be transferred onto a transfer target. The plurality of detection marks is provided in the film portion, with intensity of light transmitted through the detection marks being suppressed so as to suppress transfer of the detection marks onto the transfer target.

Various embodiments will be illustrated hereinafter with reference to the accompanying drawings.

In the drawings, similar components are labeled with like reference numerals, and the detailed description thereof is omitted appropriately. By way of example, in the following is described a case where the photomask according to the embodiments is a halftone phase shift mask.

[First Embodiment]

First, a photomask according to a first embodiment is illustrated.

Figure 1B:
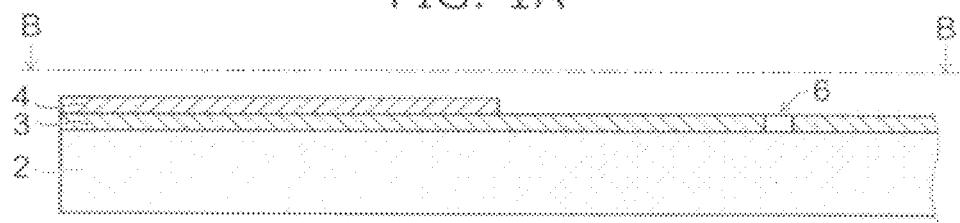
Figure 1C:
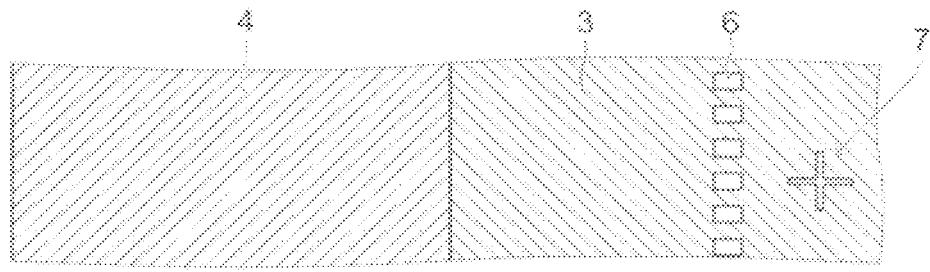

FIGS. 1A to 1C are schematic views for illustrating a photomask according to the first embodiment.

Figure 1D:
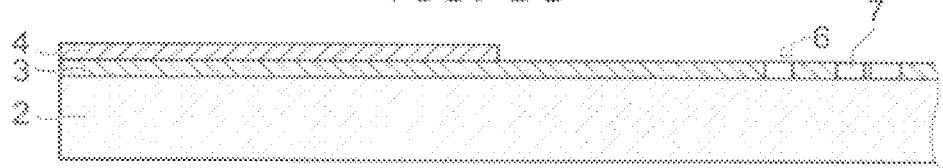
FIG. 1D is a schematic enlarged view of the cross section taken in the direction of arrows C-C.

More specifically, FIG. 1A is a schematic plan view of the photomask according to the first embodiment. FIG. 1B is a schematic enlarged view of the cross section taken in the direction of arrows A-A in FIG. 1A. FIG. 1C is a view taken in the direction of arrows B-B. FIG. 1D is a schematic enlarged view of the cross section taken in the direction of arrows C-C. Here, in FIG. 1A, the pattern 6 described later is omitted to avoid complexity, and the arrangement of detection marks 7 is conceptually shown.

As shown in FIGS. 1A and 1B, the photomask 1 includes a substrate 2, a film portion 3, a light shielding film 4, a writing region 5, a pattern 6, and a detection mark 7.

The substrate 2 is shaped like e.g. a rectangular plate. The substrate 2 can be formed from a material having high translucency. The substrate 2 can be formed from e.g. synthetic quartz glass.

The film portion 3 is provided on one surface of the substrate 2. The film portion 3 can be configured to have a light transmittance lower than the light transmittance of the substrate 2. The film portion 3 can be configured as a so-called halftone film. The film portion 3 is formed from a material based on e.g. chromium fluoride (CrF), molybdenum silicide (MoSiON, MoSiO), tungsten silicide (WSiO), or zirconium silicide (ZrSiO). The transmittance for deep ultraviolet light of the film portion 3 can be set to several %.

The light shielding film 4 is provided on the peripheral region of the substrate 2 so as to cover the film portion 3. The light shielding film 4 can be formed from e.g. chromium (Cr).

The photomask 1 includes a writing region 5.

The writing region 5 is provided on the central region of the substrate 2. The writing region 5 is a region where the pattern 6 and the detection mark 7 are formed.

The pattern 6 is provided in the film portion 3. The pattern 6 can include a circuit pattern to be transferred to a transfer target (such as a wafer), and an auxiliary pattern located adjacent to the circuit pattern for increasing the resolution of the circuit pattern.

The pattern 6 is formed by selectively removing part of the film portion 3. More specifically, the pattern 6 is composed of e.g. openings which can transmit light having light intensity enabling transfer to the transfer target.

The detection mark 7 is provided in the film portion 3. The detection mark 7 is configured to be able to suppress the intensity of transmitted light so as to suppress transfer to the transfer target. The detail of the suppression of transfer to the transfer target will be described later.

The detection mark 7 is provided to inspect the accuracy of the photomask 1 itself. For instance, if the detection mark 7 is provided in the photomask 1, the position of the detection mark 7 and the dimension between the detection marks 7 can be measured by using e.g. a photomask inspection apparatus and a dimension measurement apparatus known in the art. Thus, the accuracy of the photomask 1 can be subjected to inspection measurement easily and accurately.

If a plurality of detection marks 7 are provided, detection can be performed for the plurality of detection marks 7. Hence, by the averaging effect, variations in the detection result can be suppressed.

In general, the misplacement of e.g. the circuit pattern in the photomask is detected by comparison between the detection data (sensor data) and the reference data (design data). In this case, it is difficult to detect the misplacement of e.g. a so-called isolated hole distanced from e.g. other circuit patterns. However, if a plurality of detection marks 7 are provided, the detection mark 7 provided near e.g. the isolated hole can be used as a reference. Hence, it is also possible to improve the detection accuracy for the misplacement of e.g. an isolated hole.

The film portion 3 provided on one surface of the substrate 2 undergoes residual stress. Thus, if the film portion 3 is provided with a plurality of detection marks 7 which are also openings, the residual stress can be relaxed. As a result, the deformation of the photomask 1 can be suppressed. Hence, the positional accuracy of the pattern 6 can be improved.

When the photomask 1 is mounted on an exposure apparatus, the photomask 1 is mechanically held by the holding means provided in the exposure apparatus. In this case, if a plurality of detection marks 7 are provided in the photomask 1, it is possible to detect the amount of strain, for instance, generated when the photomask 1 is mechanically held. Then, for instance, if the amount of strain is too large, it is also possible to weaken the holding force on the photomask 1 to relax the strain generated in the photomask 1.

The detection information on the photomask 1 detected by using the detection mark 7 (such as misplacement information in the writing region 5) is fed back to the correction data of the writing position of a photomask to be manufactured the next time (such as a photomask of the same specifications and a photomask of similar specifications to be manufactured the next time). Thus, the accuracy of the photomask can be improved cumulatively.

Next, the shape, arrangement condition and the like of the detection mark 7 are illustrated.

The detection mark 7 can be shaped to have an edge.

Then, detection can be performed easily and accurately. Hence, the detection accuracy of the detection mark 7 can be improved.

The detection mark 7 can be configured to include a first edge provided in a first direction and a second edge provided in a second direction crossing the first direction. Then, the detection accuracy of the detection mark 7 in the first and second directions can be improved.

The shape of the detection mark 7 can be configured to include a portion made of vertical and horizontal straight lines. Furthermore, symmetric shape is preferable. For example, a line symmetric shape, a point symmetric shape, a rotation symmetric shape, and bilaterally and vertically symmetric shapes can be employed. For instance, the shape of the detection mark 7 can be configured to include a portion made of an arbitrary polygon, or a combined shape of a plurality of arbitrary polygons.

By way of example, in the following is described a case where the shape of the detection mark 7 is a cross shape.

For instance, the shape of the detection mark 7 can include edges in orthogonal directions like a cross shape. Then, the detection accuracy of the detection mark 7 in the two-dimensional directions can be improved.

Figure 2A:
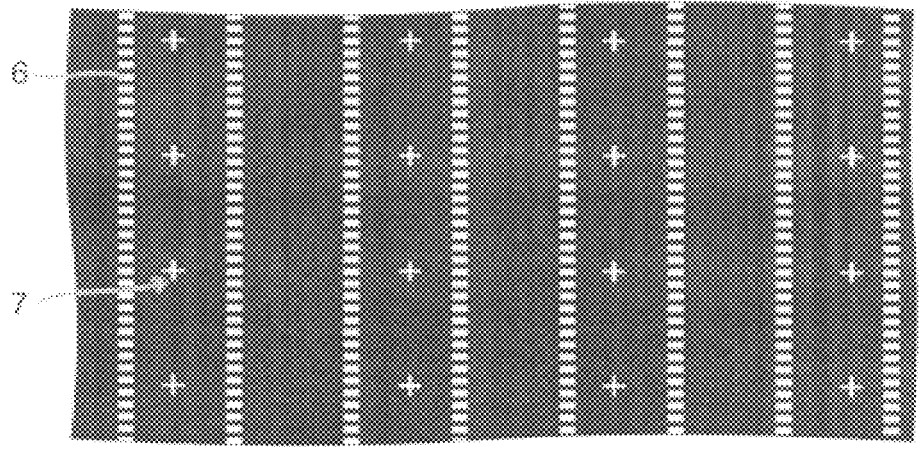
FIGS. 2A and 2B are schematic plan views for illustrating the arrangement of detection marks.
Figure 2B:
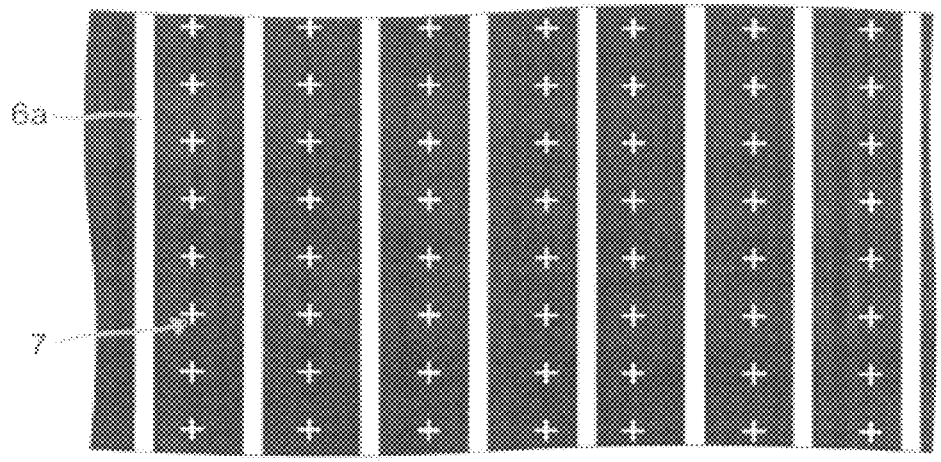

FIGS. 2A and 2B are schematic plan views for illustrating the arrangement of the detection marks.

In FIG. 2A, as an example, a hole-like pattern 6 penetrating through the film portion 3 is written, in FIG. 2B, as other example, a line-like pattern 6a penetrating through the film portion 3, respectively.

Between FIGS. 2A and 2B, the dimension and arrangement of the hole patterns 6 and 6a are different. However, there is no difference in that the detection mark 7 is provided in the film portion 3, i.e., in the portion where the hole pattern 6 of the line pattern 6a is not provided.

The detection marks 7 can be provided in a matrix configuration as shown in FIGS. 1A, 2A, and 2B. For example, FIG. 1A shows the case where the arrangement pitch of the detection marks 7 is 10 mm. FIG. 2A shows the case where the arrangement pitch of the detection marks 7 is 1 mm. FIG. 2B shows the case where the arrangement pitch of the detection marks 7 is 100 μm.

However, the arrangement of the detection marks 7 is not limited to the matrix configuration. For instance, the detection marks 7 may be arranged in other regular configurations such as a staggered configuration, or in a configuration in which the detection marks 7 are provided at arbitrary positions such as an isolated pattern.

The dimension between the detection marks 7 may be constant (equal pitch dimension) or may be varied. Furthermore, it is also possible to mix a portion where the dimension between the detection marks 7 is constant and a portion where the dimension is varied. In this case, if the dimension between the detection marks 7 is made too large, the inspection accuracy may be degraded. On the other hand, if the dimension between the detection marks 7 is made too small, the number of detection marks 7 becomes too large, which may decrease the measurement efficiency. Thus, the dimension between the detection marks 7 and the number of detection marks 7 can be appropriately changed depending on the required inspection accuracy and inspection efficiency.

Furthermore, the arrangement of the detection marks 7 can be unevenly distributed. For instance, if the portion prone to degradation in dimensional accuracy is empirically known, the dimension between the detection marks 7 in that portion can be decreased, or the number of detection marks 7 therein can be increased. Furthermore, if the portion likely to have good dimensional accuracy is empirically known, the dimension between the detection marks 7 in that portion can be increased, or the number of detection marks 7 therein can be decreased.

Here, the detection mark 7 is formed by selectively removing part of the film portion 3. Hence, although light is transmitted through the detection mark 7, the detection mark 7 is not transferred to the transfer target. Because the detection mark 7 is not transferred to the transfer target, the restriction on the position for providing the detection mark 7 can be significantly relaxed. Thus, the detection mark 7 can be easily provided at a position suitable for inspection measurement of the photomask. Hence, the inspection accuracy of the photomask 1 can be significantly improved.

That is, the intensity of light transmitted through the detection mark 7 is suppressed so as to suppress the transfer to the transfer target. For instance, in the case where the shape of the detection mark 7 is a rectangular shape or a combined shape of a plurality of rectangular shapes such as a cross shape, the transfer of the detection mark 7 to the transfer target can be suppressed by making the width dimension (length of the short side) of the rectangular shape smaller than a prescribed value.

Figure 3:
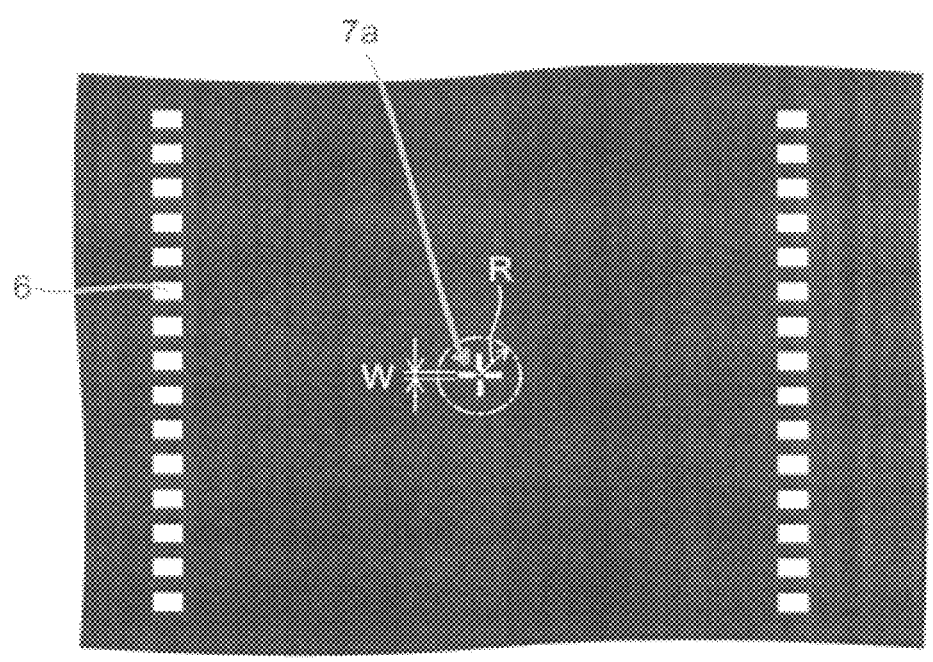
FIG. 3 is a schematic view for illustrating the dimensional condition and the like for avoiding the transfer of the detection mark to the transfer target.

FIG. 3 is a schematic view for illustrating the dimensional condition and the like for avoiding the transfer of the detection mark to the transfer target.

Here, FIG. 3 illustrates the case where the shape of the detection mark 7a is a cross shape.

In this case, for instance, in the case where the wavelength of the exposure light is approximately 193 nm, the transfer of the detection mark 7a to the transfer target can be suppressed by setting the width dimension W of the rectangular shape constituting the cross shape to less than 160 nm.

Furthermore, the transfer of the detection mark 7a to the transfer target can be suppressed more reliably by setting the width dimension W of the rectangular shape constituting the cross shape to 120 nm or less.

However, even in the case of suppressing the transfer of the detection mark 7a, if the detection mark 7a is provided too close to the pattern 6, the transfer accuracy of the pattern 6 and the like may be affected.

Thus, the detection mark 7a is provided at a position such that the pattern 6 (in the case illustrated in FIG. 3, the hole-like pattern 6) is excluded from a prescribed range around the detection mark 7a.

According to the knowledge obtained by the inventors, the influence of the detection mark 7a on the transfer accuracy of the pattern 6 and the like can be suppressed by excluding the pattern 6 from the range of 2 μm from the detection mark 7a.

That is, preferably, the detection mark 7a is provided so that the dimension between the pattern 6 and the detection mark 7a is 2 μm or more.

Furthermore, the transfer of the detection mark 7a to the transfer target is further hindered by decreasing the resolution of the detection mark 7a.

In this case, the transfer of the detection mark 7a to the transfer target is further hindered by decreasing the optical image (aerial image) contrast in the transfer of the detection mark 7a.

FIGS. 4A to 4D are schematic views for illustrating a detection mark for decreasing the optical image (aerial image) contrast when being transferred.

Figure 4A:
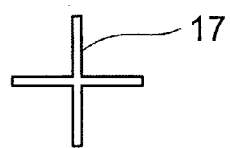
FIGS. 4A to 4D are schematic views for illustrating a detection mark for decreasing the optical image (aerial image) contrast when being transferred.
Figure 4B:
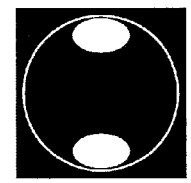
Figure 4C:
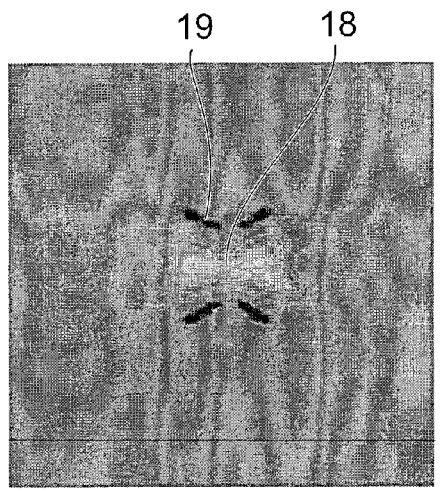
Figure 4D:
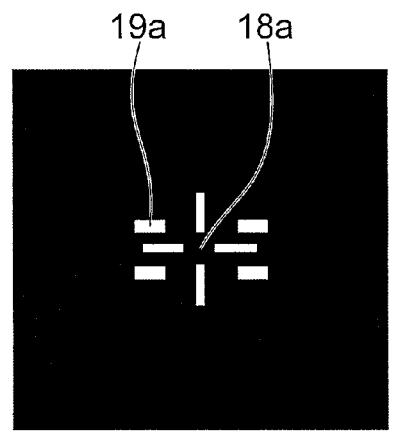

More specifically, FIG. 4A is a schematic view for illustrating a detection mark before optical image contrast adjustment. FIG. 4B is a schematic view for illustrating an illumination shape for light exposure. FIG. 4C is a schematic view for illustrating the optical image in the transfer target. FIG. 4D is a schematic view for illustrating a detection mark after optical image contrast adjustment.

Here, FIG. 4C is obtained by simulation of the transfer of the detection mark illustrated in FIG. 4A. The optical image is represented by monotone shading, with a darker portion shaded more intensely, and a lighter portion shaded less intensely.

The detection mark 17 having a cross shape as illustrated in FIG. 4A is irradiated with exposure light from a dipole illumination as illustrated in FIG. 4B. Then, the optical image in the transfer target is as illustrated in FIG. 4C.

In this case, as shown in FIG. 4D, the film portion 18a can be provided at the position corresponding to the light portion 18 in FIG. 4C, and the opening 19a (corresponding to an example of the first control portion) can be provided at the position corresponding to the dark portion 19. Then, the difference in brightness between the light portion 18 and the dark portion 19 can be reduced. Hence, the optical image contrast can be decreased. That is, the detection mark 17 can be configured to include an opening 19a and a film portion 18a for decreasing the optical image contrast in the transfer target by transmitting light.

Thus, the detection mark 17 can be configured so as to decrease the optical image contrast when being transferred. Then, even if there are differences between the apparatuses in the light exposure condition or variations in the apparatus condition, the transfer to the transfer target can be further hindered.

The example illustrated in FIG. 4D includes a film portion 18a and an opening 19a. However, it is only necessary that at least one of the film portion 18a and the opening 19a be provided so as to decrease the optical image contrast when being transferred.

Here, in the case of a circuit pattern, an auxiliary pattern is provided at a position capable of increasing the resolution. The case of the detection mark 17 is different in that at least one of the film portion 18a and the opening 19a is provided at a position capable of decreasing the resolution.

Furthermore, the shape of the detection mark can be configured so as to decrease the optical image contrast when being transferred.

FIGS. 5A to 5D are schematic views for illustrating the shape of a detection mark for decreasing the optical image contrast when being transferred.

For instance, in the case where the shape of the detection mark 7 is a cross shape, the brightness tends to be brighter at the position corresponding to the neighborhood of the center of the detection mark 7 in the transfer target.

Figure 5A:
FIGS. 5A to 5D are schematic views for illustrating the shape of a detection mark for decreasing the optical image contrast when being transferred.

In this case, for instance, as illustrated in FIG. 5A, the detection mark 27 can be configured to radially include slim rectangular openings 27a with a spacing of a prescribed dimension from the center. This can suppress excessively high brightness at the position corresponding to the neighborhood of the center of the detection mark 27 in the transfer target.

Figure 5B:
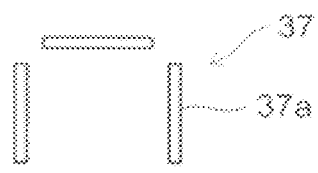

Alternatively, as illustrated in FIG. 5B, the detection mark 37 can be configured to include slim rectangular openings 37a like a frame with a spacing of a prescribed dimension from the center. This can suppress excessively high brightness at the position corresponding to the four corners of the detection mark 37 in the transfer target.

That is, the detection mark can be configured to include, at a prescribed position, a suppression portion (corresponding to an example of the second control portion) for suppressing light transmission to decrease the optical image contrast in the transfer target.

Here, the aforementioned film portion 18a corresponds to an example of the suppression portion.

Figure 5C:
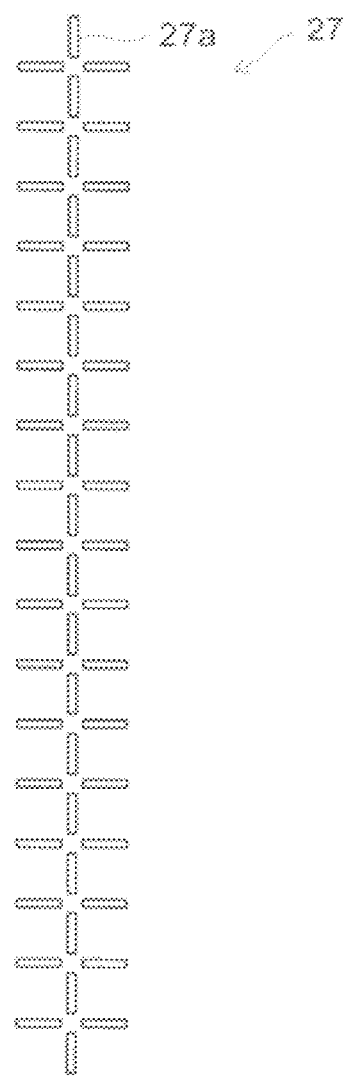

As shown in FIG. 5C, a plurality of the detection mark 27 shown in FIG. 5A can be arranged side by side along one direction. By using this arrangement, accuracy of the detection of position can be further improved as the number of the openings 27a as targets is increased. In this case, odd number of the detection mark 27 shown in FIG. 5A can be arranged in order to make one of the detection marks 27 located center as shown in FIG. 5C.

Figure 5D:
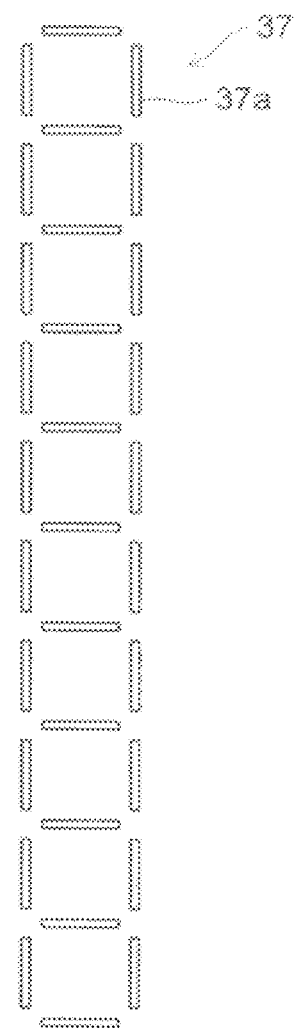

As shown in FIG. 5D, a plurality of the detection mark 37 shown in FIG. 5D can be arranged side by side along one direction. By using this arrangement, accuracy of the detection of position can also be further improved. In this case, even number of the detection marks 37 can be arranged in order to make one of the openings 37 located center as shown in FIG. 5D.

In the embodiments, the arrangements of the plurality of detection marks 27 and 37 are not limited to the one-dimensional arrangement as shown in FIGS. 5C and 5D, but two-dimensional arrangements are also included.

[Second Embodiment]

Next, a method for manufacturing a photomask according to a second embodiment is illustrated.

Figure 6A:
FIGS. 6A to 6C are schematic process sectional views for illustrating a method for manufacturing a photomask according to a second embodiment.
Figure 6B:
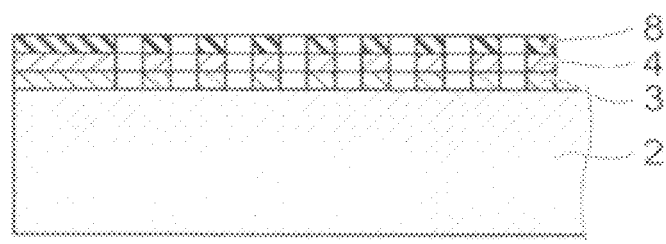
Figure 6C:
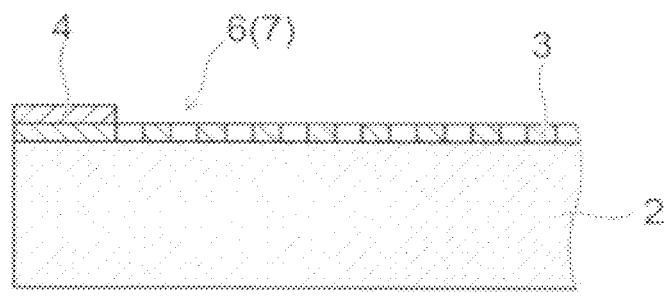

FIGS. 6A to 6C are schematic process sectional views for illustrating the method for manufacturing a photomask according to the second embodiment.

First, as shown in FIG. 6A, on one surface of a substrate 2 formed from e.g. quartz glass, a film portion 3 having a light transmittance lower than the light transmittance of the substrate 2 is formed.

The film portion 3 can be formed by film formation of a material based on e.g. chromium fluoride (CrF), molybdenum silicide (MoSiON, MoSiO), tungsten silicide (WSiO), or zirconium silicide (ZrSiO) by the sputtering method.

Next, a light shielding film 4 is formed so as to be stacked on the upper surface of the film portion 3.

The light shielding film 4 can be formed by film formation of e.g. chromium (Cr) by using the sputtering method. Thus, a photomask blank is formed.

Next, as shown in FIG. 6B, a resist 8 is applied to the upper surface of the light shielding film 4. The resist 8 can be applied by using a known application method such as the spin-coating method.

Then, by using e.g. the electron beam writing method, a pattern 6 (such as circuit pattern and auxiliary pattern) to be transferred to a transfer target and a detection mark are written to the resist 8 based on writing data created previously.

At this time, based on the writing data, the detection mark in which the intensity of transmitted light is suppressed so as to suppress the transfer to the transfer target is written.

The detection mark to be written can be configured to have a rectangular shape with the width dimension of the rectangular shape set to less than 160 nm.

Furthermore, the writing can be performed so that the dimension between the pattern 6 and the center of the detection mark is 2 μm or more.

The detection mark to be written can be made similar to those described above, and hence the detailed description thereof is omitted.

Next, the resist 8 with the pattern 6 and the detection mark written thereto is baked and subjected to spray development with an alkaline developer to form a resist mask.

Then, the resist mask is used as an etching mask to sequentially remove the light shielding film 4 and the film portion 3 by using the RIE (reactive ion etching) method.

Next, the resist mask is removed by using e.g. the dry ashing method or washing method.

Next, as shown in FIG. 6C, the light shielding film 4 in the writing region 5 is removed by using e.g. the wet etching method. Thus, a photomask 1 including the pattern 6 and the detection mark is manufactured.

The photomask 1 thus manufactured is used in the light exposure process in manufacturing microstructures such as semiconductor devices.

Furthermore, the accuracy of the manufactured photomask 1 is detected by using the detection mark. The detected information of the photomask 1 is fed back to the correction data of the writing position of the photomask to be manufactured the next time (such as a photomask of the same specifications and a photomask of similar specifications to be manufactured the next time).

Next, by way of example, in the following is described a case where the detected information of the photomask is fed back to the manufacturing of a photomask to be manufactured the next time.

Figure 7:
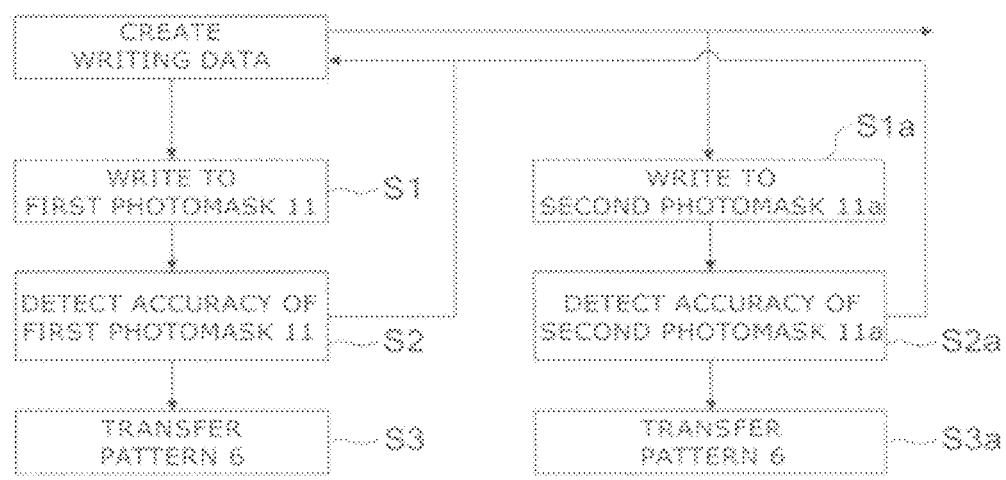
FIG. 7 is a flow chart for illustrating a process for manufacturing a photomask.

FIG. 7 is a flow chart for illustrating a process for manufacturing a photomask.

As shown in FIG. 7, first, writing data on a first photomask 11 is created. Here, the created writing data includes not only data on a pattern 6 (such as circuit pattern and auxiliary pattern) but also data on a detection mark.

Next, similarly to the foregoing, writing for manufacturing the first photomask 11 is performed (step S1).

At this time, the detection mark is also written in conjunction with the pattern 6.

Next, the accuracy of the writing position of the first photomask 11 with the detection mark written thereto is detected by the detection mark (step S2).

The detection of the accuracy of the first photomask 11 can be performed by measuring the position of the detection mark and the dimension between the detection marks by using e.g. a photomask inspection apparatus and a dimension inspection apparatus known in the art.

The information on the detected accuracy of the first photomask 11 is fed back to the writing data of a second photomask 11a to be manufactured the next time. For instance, the correction data of the writing position can be modified based on the detected accuracy of the first photomask 11.

Then, in the light exposure process, the first photomask 11 is used to transfer the pattern 6 to a transfer target (step S3).

At this time, the transfer of the detection mark formed on the first photomask 11 to the transfer target is suppressed.

Then, writing for manufacturing the second photomask 11a is performed based on the writing data to which the information on the accuracy of the first photomask 11 has been fed back (step S1a).

That is, in the manufacturing of the second photomask 11a, the pattern 6 is written based on the modified writing data. At this time, the detection mark is also written in conjunction with the pattern 6.

Next, the accuracy of the second photomask 11a is detected by using the detection mark (step 52a). The information on the detected accuracy of the second photomask 11a is fed back to the writing data of a photomask to be manufactured the next time.

Thus, the accuracy of the photomask can be improved cumulatively.

Then, similarly to the foregoing, in the light exposure process, the second photomask 11a is used to transfer the pattern 6 to a transfer target (step S3a).

The embodiments illustrated above can realize a photomask capable of improving the inspection measurement accuracy and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

For instance, the shape, dimension, material, arrangement, number and the like of the components included in e.g. the first photomask 11 are not limited to those illustrated, but can be suitably modified.

In the foregoing, by way of example, the case where the photomask is a halftone phase shift mask has been described. However, the embodiments are not limited thereto.

For instance, the embodiments are applicable to various photomasks such as a binary mask, Levenson-type phase shift mask, chromeless phase shift mask, and EUV (Extreme Ultra Violet) mask.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A photomask comprising:
    a substrate;
    a film portion provided on a surface of the substrate and having a light transmittance lower than light transmittance of the substrate;
    a pattern provided in a surface of the film portion and configured to be transferred onto a transfer target; and
    a plurality of detection marks provided in the film portion, with intensity of light transmitted through the detection marks being suppressed so as to suppress transfer of the detection marks onto the transfer target, the intensity of light being suppressed by an optical image contrast being decreased, the optical image contrast being decreased in consideration of an illumination shape for light exposure.

2. The photomask according to claim 1, wherein one of the detection marks includes a first edge provided in a first direction and a second edge provided in a second direction crossing the first direction.

3. The photomask according to claim 1, wherein one of the detection marks has a symmetric rectangular shape of rectangular openings, and each rectangular opening has a width dimension of less than 160 nm.

4. The photomask according to claim 1, wherein one of the detection marks is provided so that a spacing dimension is 2 μm or more between the pattern and one of the detection marks.

5. The photomask according to claim 1, wherein the plurality of the detection marks are arranged in a one-dimensional or a two-dimensional arrangement.

6. The photomask according to claim 1, wherein one of the detection marks further includes a first control portion configured to decrease the optical image contrast in the transfer target by transmitting light.

7. The photomask according to claim 1, wherein one of the detection marks further includes a second control portion configured to decrease the optical image contrast in the transfer target by suppressing light transmission.

8. The photomask according to claim 1, wherein one of the detection marks has at least one shape including a portion made of a polygon on a combined shape of a plurality of polygons.

9. The photomask according to claim 1, wherein a spacing dimension is constant between the plurality of detection marks.

10. The photomask according to claim 1, wherein the plurality of detection marks are provided in a matrix configuration.

11. The photomask according to claim 1, wherein a first number of the detection marks provided in a portion expected to be prone to degradation in dimensional accuracy is larger than a second number of the detection marks provided in a portion expected to have good dimensional accuracy.

* * * * *